United States Patent [19]

Terada et al.

[11] Patent Number: 5,581,486
[45] Date of Patent: Dec. 3, 1996

[54] MAINTENANCE MANAGEMENT SYSTEM FOR MANAGING MAINTENANCE OF COMPONENTS OF ASSEMBLY APPARATUS

[75] Inventors: Yukihiro Terada, Saitama; Hirohide Maenaka, Tokyo; Yukio Kawazu, Saitama, all of Japan

[73] Assignee: Sony Corporation, Tokyo, Japan

[21] Appl. No.: 546,350

[22] Filed: Oct. 20, 1995

Related U.S. Application Data

[63] Continuation of Ser. No. 155,651, Nov. 22, 1993, abandoned.

[30] Foreign Application Priority Data

Nov. 30, 1992 [JP] Japan ................................. 4-343398

[51] Int. Cl.$^6$ .............................. G06F 19/00; G06F 17/60
[52] U.S. Cl. ................ 364/569; 364/474.16; 364/468.01
[58] Field of Search ............................... 364/550, 551.01, 364/424.03, 469, 569, 509, 468, 474.16, 401, 431.01, 431.04, 474.19

[56] References Cited

U.S. PATENT DOCUMENTS

| 4,404,641 | 9/1983 | Bazarnik | 364/569 |
|---|---|---|---|
| 4,539,632 | 9/1985 | Hansen et al. | 364/569 |
| 4,918,585 | 4/1990 | Miller et al. | 364/509 |
| 5,216,612 | 6/1993 | Cornett et al. | 364/468 |
| 5,231,594 | 7/1993 | Knibiehler et al. | 364/551.01 |

FOREIGN PATENT DOCUMENTS 0480059  4/1992  European Pat. Off. .

Primary Examiner—Emanuel T. Voeltz
Assistant Examiner—M. Kemper
Attorney, Agent, or Firm—Jay H. Maioli

[57] ABSTRACT

A maintenance management system includes a storage unit for storing maintenance items and maintenance intervals of the members of an assembly apparatus a time information generation unit which counts the time information concerning the time from a certain reference time or date and outputs the time information signal into a comparing unit that compares the time information signal with the maintenance intervals stored in the storage unit. When a corresponding maintenance item is due, a signal alerting this fact is output to the alerting unit. The value of the maintenance interval is input to the comparing unit, whereby detailed maintenance items corresponding to the maintenance interval are output to the alerting unit.

9 Claims, 5 Drawing Sheets

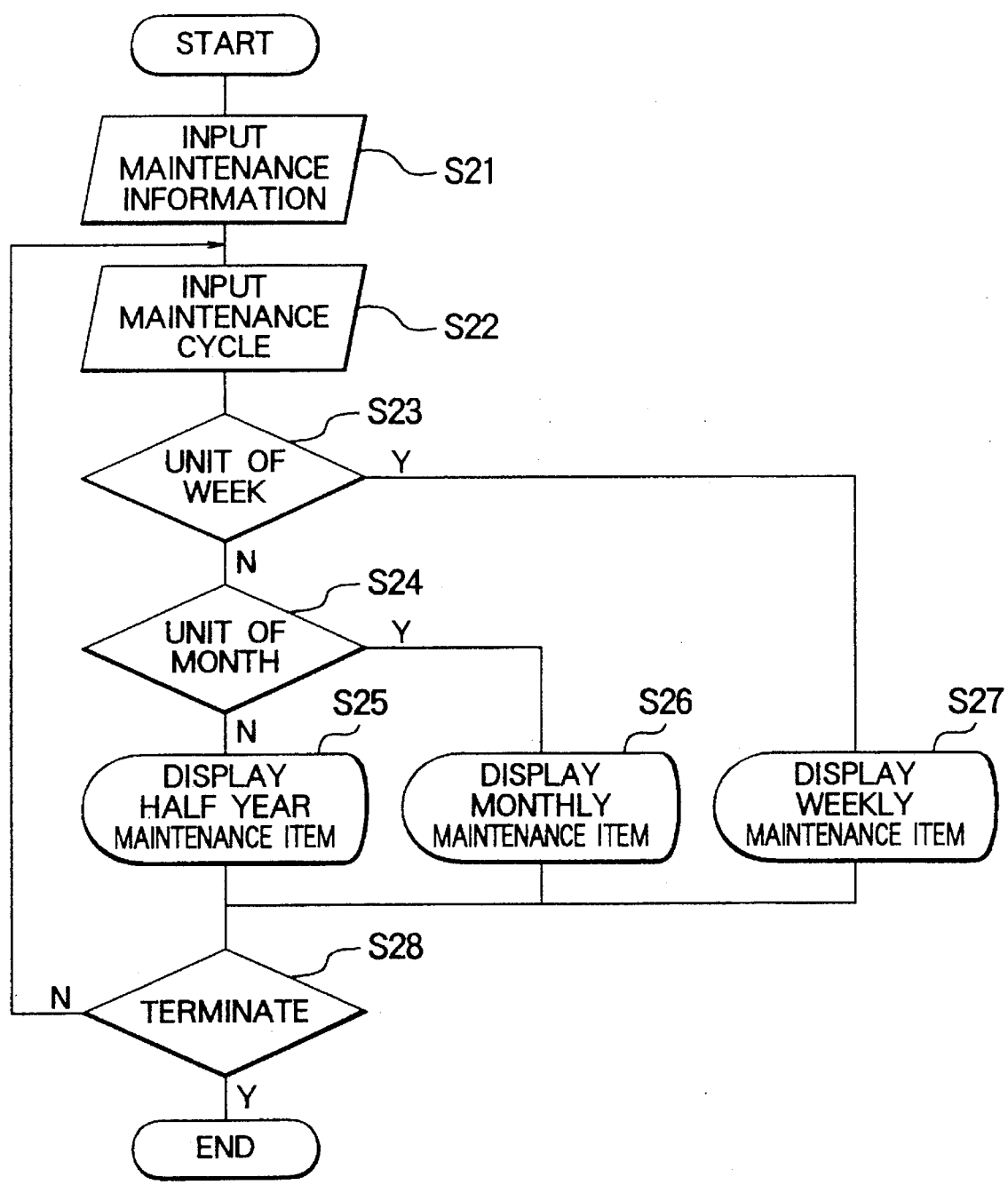

FIG. 5

| NAME OF UNIT | | NAME OF COMPONENT | MAINTENANCE ITEM | TYPE OF OIL | DAY AND TIME |
|---|---|---|---|---|---|
| COMPONENT SUPPLY UNIT | Z-AXIS UNIT | LM GUIDE (53) | SUPPLY OF OIL | NO2 | EVERY MONTH |
| | | BALL SCREW (52) | SUPPLY OF OIL | NO2 | EVERY MONTH |
| | | SUPPORT PLATE (32) | CLEANING | | EVERY MONTH |
| | FRONT CUT CUTTER UNIT | SLIDE HOLDER (4,5) | SUPPLY OF OIL | NO2 | EVERY MONTH |
| | | LM SHAFT (27) | SUPPLY OF OIL | NO2 | EVERY MONTH |
| | | CUTTER PERIPHERY (6~10) | CLEANING | | EVERY DAY |
| | DUST BOX | PLASTIC CONTAINER (18) | CLEANING | | EVERY DAY |
| MAIN DRIVE UNIT | CAM SHAFT | CAM (17) | SUPPLY OF OIL | NO1 | EVERY WEEK |
| | | ROLLER FOLLOW | SUPPLY OF OIL | NO1 | EVERY WEEK |
| | LOCK OUT UNIT | SUPPORT POINT SHAFT BEARING PORTION | CLEANING AND SUPPLY OF OIL | TURBINE 32 | EVERY MONTH |

MAINTENANCE MANAGEMENT SYSTEM FOR MANAGING MAINTENANCE OF COMPONENTS OF ASSEMBLY APPARATUS

This is a continuation of application Ser. No. 08/155,651 filed Nov. 22, 1993, abandoned.

BACKGROUND OF THE INVENTION

1. Field of the Invention

The present invention relates to an assembly apparatus equipped with a maintenance management function which is used in an assembly apparatus including for example an electronic component mounting machine etc. and can automatically perform the management of the maintenance of that mounting machine.

2. Description of the Related Art

Japanese Patent Publications (JPP) 1-157600 and 1-183893 disclose an electronic component (part) mounting (supplying) apparatus.

Such a machine mounting electronic components on a circuit board is made of a board conveying unit and positioning unit which conveys the circuit board and performs the positioning, a component supply unit which supplies the electronic components, mount heads which obtain the electronic components from the component supply unit and perform packaging with respect to the predetermined positions of the circuit board mounted on the conveying device, and a station unit.

In such a mounting machine of electronic components, the mount heads must be operated in three-dimensional directions with respect to the circuit board with high precision in addition to high accuracy operation of the conveying unit which conveys the circuit board. Also, in addition to this, it is necessary to mount various types of electronic components on the circuit board at predetermined positions in accordance with the specifications, and therefore the construction is such that the component supply unit can also be appropriately moved with respect to the mount heads.

For this reason, if the quality of assembly of the electronic component mounting machine is to be maintained, it is necessary to manage the periodic maintenance of the apparatus. In such a conventional maintenance management, previously determined maintenance inspection items have been examined by a worker.

In maintenance management by a worker, however, there was a tendency for the maintenance inspection work to be affected by the work schedule of the worker, and therefore there was a concern that the maintenance would not be carried out at an appropriate time. Moreover, there was another concern that the maintenance inspection interval would be overlooked due to an error.

In addition, where maintenance inspection is carried out, it is necessary to examine the maintenance items by checking the inspection manual of the mounting machine. When there are many items with different maintenance inspection intervals and so on, mistakes or omissions of the inspection item may occur.

SUMMARY OF THE INVENTION

An object of the present invention is to provide an assembly apparatus equipped with a maintenance management function which automatically manages the maintenance inspection intervals for eliminating human error when maintenance management is to be carried out and, in addition, which automatically alerts a worker as to the inspection items at that time.

So as to achieve the above-described object, an assembly apparatus having members to be maintained is equipped with a maintenance management function of the present invention that includes a storage unit which stores maintenance items and maintenance intervals of the members; a time information generation unit which measures the time information concerning the time from a certain reference time and a calendar date and outputs the same; and a comparing unit which obtains the time information signal from the time information generation unit, compares the same with the maintenance intervals stored in the storage unit, and, when a corresponding maintenance item exists, outputs a signal alerting the outside of this fact.

The above comparing unit preferably outputs the maintenance items corresponding to a maintenance interval by receiving as its input the value of the maintenance interval.

Also, preferably, when there are corresponding maintenance items as a result of comparison by the above comparing unit, an alert signal is given of this fact when the assembly apparatus is activated.

Describing each element, first, the maintenance items and maintenance intervals of the members to be maintained are input to the storage unit of the assembly apparatus equipped with the maintenance management function of the present invention and stored therein. When the assembly apparatus is activated from this state, time information such as the time, day, month, year, etc., counted from a certain reference time, is applied to the comparing unit. This information is compared with the information of the maintenance interval stored in the storage unit.

Here, when the maintenance interval indicates that maintenance is due, a signal is output to the outside to alert the worker to that effect. By this, it is possible to prevent a mistake and omission of the maintenance interval.

On the other hand, when the worker inputs the value of the corresponding maintenance interval, detailed information of the maintenance items corresponding to that maintenance interval is output from the storage unit by the comparing unit. By this, the worker can be alerted of the items which should be maintained, and mistakes and omissions of the maintenance items can be prevented.

According to the present invention, an assembly apparatus is constituted so that maintenance inspection work is not affected by the working schedule of the worker, and the maintenance is reliably carried out at a suitable timing. In addition, the omission of the maintenance inspection interval due to an error can be prevented.

Also, the comparing unit outputs the detailed maintenance items corresponding to the maintenance interval by receiving as its input the value of the maintenance interval, and therefore it is not necessary to check the inspection manual every time and examine the maintenance items. Even in a case where many items having different maintenance inspection intervals exist, the mistake and omission of the inspection items can be prevented.

In addition, if the assembly apparatus is constituted that, as a result of the comparison by the comparing unit, when the corresponding maintenance item exists, this fact is alerted to the outside when the assembly apparatus is activated, the above-described effects are further promoted. Thus it is preferable for the realization of reliable maintenance.

BRIEF DESCRIPTION OF THE DRAWINGS

The above objects and features and other objects and features of the present invention will be described in detail with reference to the accompanying drawings, in which:

FIG. 4 is a flow chart showing the processing routine of information concerning a management function of maintenance items of an embodiment of the present invention; and FIG. 5 is a table showing an example of the maintenance items of an embodiment of the present invention.

DESCRIPTION OF THE PREFERRED EMBODIMENTS

Figure 1:
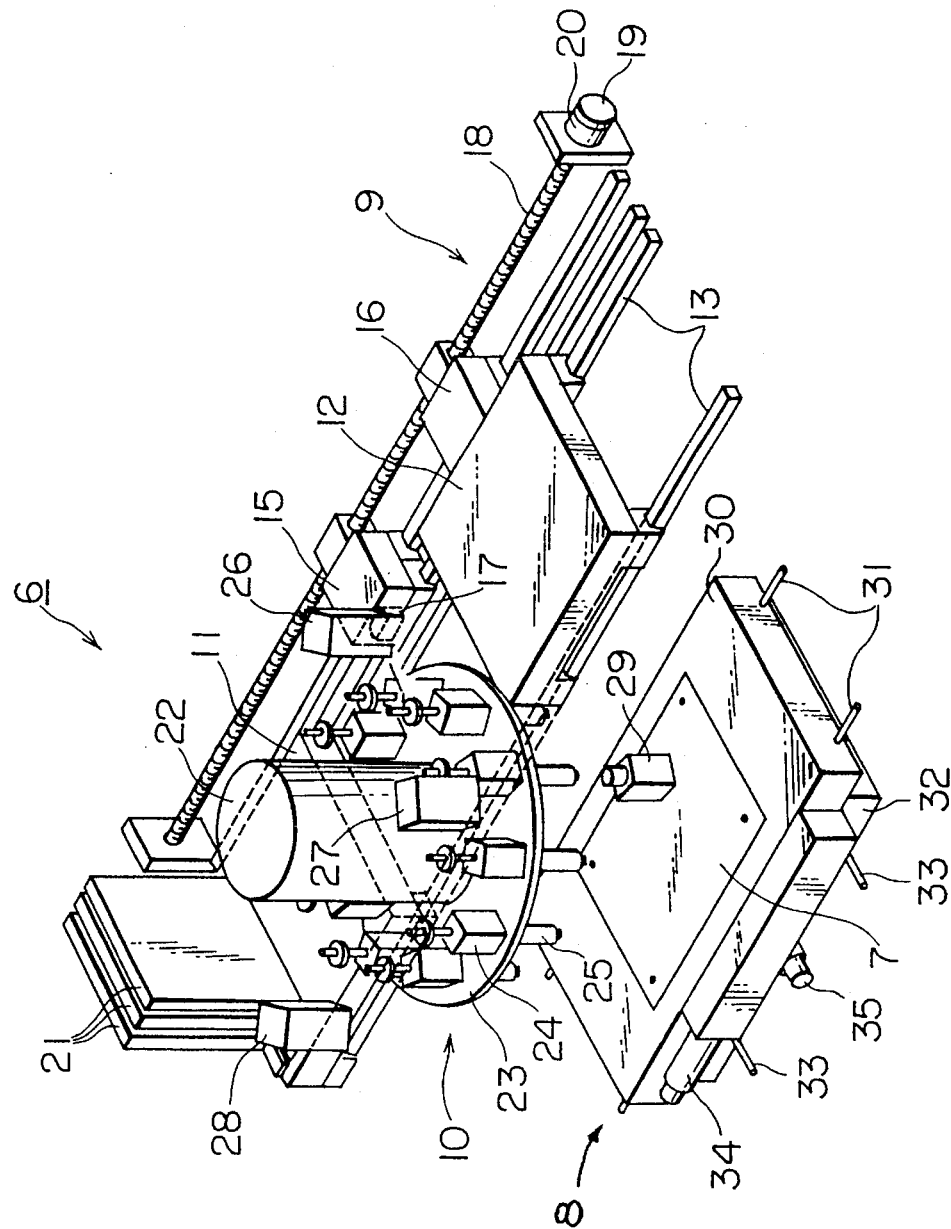
FIG. 1 is a perspective view showing an assembly apparatus to which a maintenance system of the present invention is applied.
Figure 2:
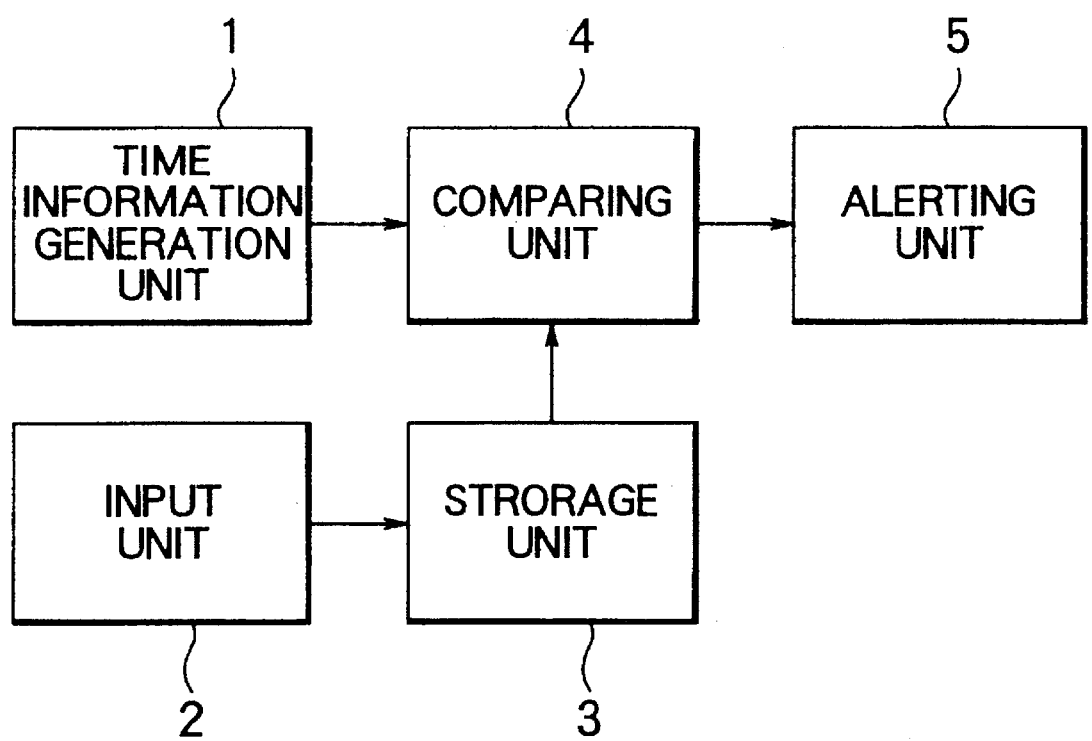
FIG. 2 is a block diagram showing a principal part of a maintenance system for the assembly apparatus, equipped with a maintenance management function according to an embodiment of the present invention.

In this specification, an assembly apparatus in accordance with the present invention includes a mounting machine 6 shown in FIG. 1 and a maintenance system 100 shown in FIG. 2.

An embodiment of the present invention will be explained below with reference to the drawings.

First of all, an explanation will be made of the structure of a mounting machine of electronic components given as an example of an assembly apparatus including the maintenance management function. FIG. 1 is a perspective view showing the mounting machine 6 of the embodiment in accordance with the present invention, which mounts electronic components on a circuit board.

This mounting machine 6 includes a board conveying unit and positioning unit 8 which conveys the circuit board 7 and performs the positioning, a component supply unit 9 which supplies the electronic components, a component mount station 10 which picks up the electronic components from the component supply unit 9 and performs the packaging at the predetermined positions of the circuit board 7 mounted on the board conveying device 8.

The component supply unit 9 is provided with split component supply bases 11 and 12. Both of these component supply bases 11 and 12 are supported by a pair of guide rails 13 in a transverse direction thereof. Also, the component supply bases 11 and 12 are provided with base drive blocks 15 and 16. When their engagement members 17 are engaged with the component supply bases 11 and 12, they move in the transverse direction by means of a feed screw 18. Note that, the feed screw 18 is driven by a motor 20 provided with an encoder 19.

On the component supply bases 11 and 12, component cassettes 21 are disposed. Various types of components, such as electronic components, are accommodated in these component cassettes 21 in a wound state in the form of reels.

In front of the component supply stations 11 and 12, a component mount station 10 is disposed. This component mount station 10 is provided wish a main shaft 22. A rotary disk 23 rotates on the outer circumference of the main shaft 22. On the rotary disk 23, a plurality of mount heads 24 are disposed. Vacuum suction nozzles 25 are attached to the lower ends of them.

Also, on the outer circumference of this rotary disk 23, a θ-rotation actuator 26, Δθ rotation actuator 27, and −(θ+Δ) rotation actuator 28 are disposed. Note that, a video camera 29 is disposed at a predetermined position beneath the rotary disk 23.

At the mount position of the rotary disk 23, the circuit board 7 is disposed. This is supported by a table 30. The table 30 is movably supported by an X-axis directional guide rod 31. A supporting means (not illustrated) supporting the guide rod 31 is supported by a base 32. This base 32 is supported by a Y-axis directional guide rod 33. Note that, the table 30 and the base 32 are moved by an X-axis directional motor 34 and a Y-axis directional motor 35, respectively.

In such a mounting machine of electronic components, first, the electronic components which should be mounted and fixed on the circuit board 7 are selected by the movement of the component supply bases 11 and 12. Components are taken out of the component cassettes 21 by the vacuum suction nozzles 25 of the mount heads 24 located at the pick-up positions of the rotary disk 23.

Then, the rotary disk 23 intermittently rotates by 36 degrees at a time. At a position of 72 degrees of rotation from the suction position, the rotary disk 23 rotates in the mounting direction by the θ-rotation actuator 26.

Further, at the position of rotation of 36 degrees, the posture of the component is detected by the video camera 29 disposed below. At a position after further rotation by 36 degrees from there, the correction of the mounting direction is carried out by the Δθ-rotation actuator 27. Then, the rotary disk 23 is rotated by 180 degrees from the suction position, whereupon the vacuum suction nozzles 25 of the mount heads 24 release the components and package the same on the circuit board 7. Thereafter, the rotary disk 23 rotates by 36 degrees, whereupon the mount heads 24 are returned by the −(θ+Δ) rotation actuator 28 so that the original rotation angle is exhibited.

Note that, the circuit board 7 is adjusted to move in different directions by the X-axis directional motor 34 and Y-axis directional motor 35, whereby the components held by the vacuum suction nozzles 25 of the mount heads 24 are mounted on the circuit board 7 at their predetermined positions.

Next, an explanation will be made of the structure of the maintenance management function according to the present invention given to the above-mentioned electronic component packaging machine.

Figure 3:
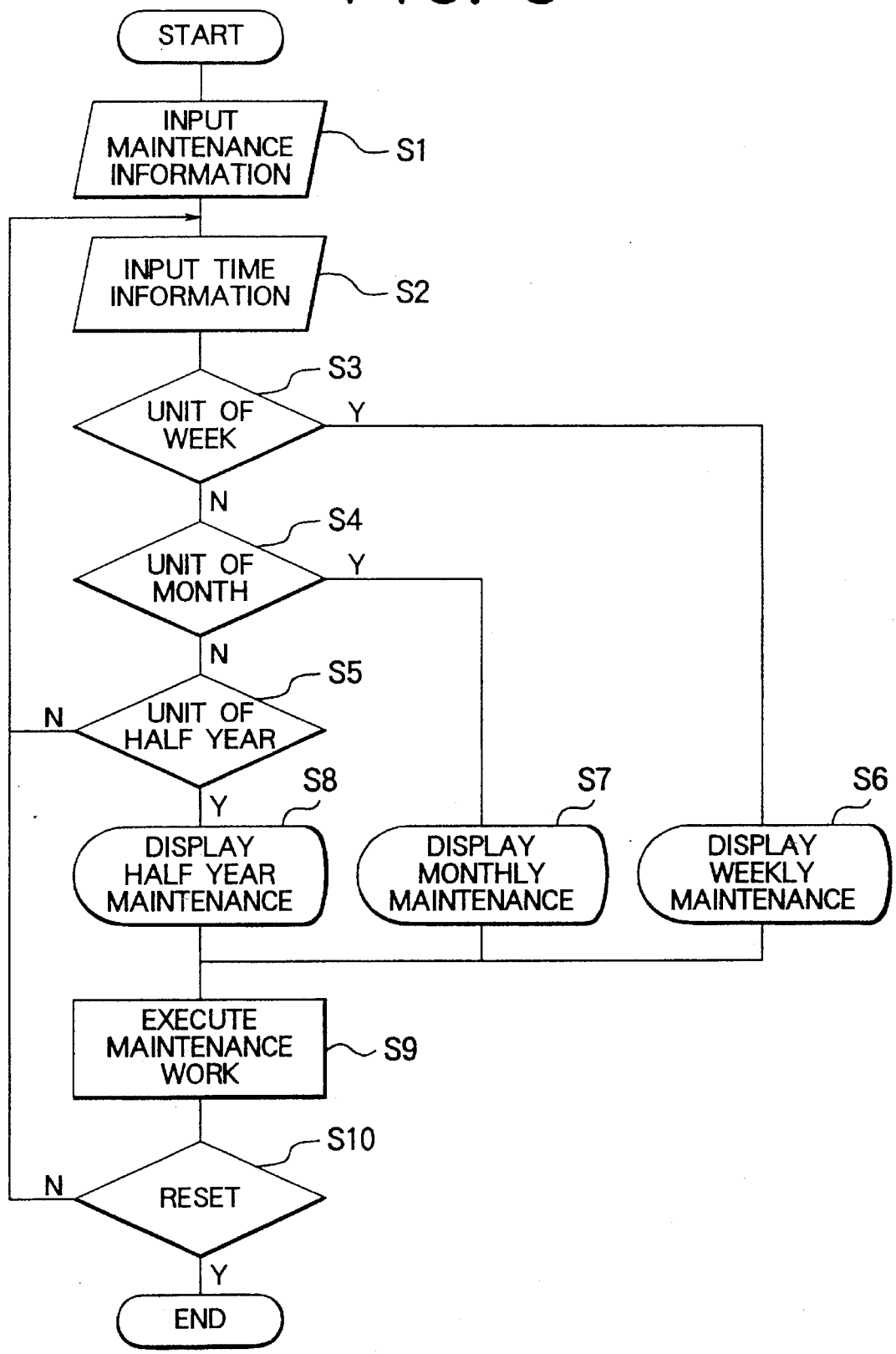
FIG. 3 is a flow chart showing the processing routine of information concerning a management function of maintenance timing of an embodiment of the present invention.

FIG. 2 is a block diagram showing principal parts of the maintenance system 100 having a maintenance management function according to an embodiment of the present invention; FIG. 3 is a flow chart showing the processing routine of the information concerning the management function of the maintenance timing of the embodiment; FIG. 4 is a flow chart showing the processing routine of the information concerning the management function of the maintenance items of the embodiment; and FIG. 5 is a table showing one example of the information format concerning the maintenance items of the embodiment.

As shown in FIG. 2, the time information generation unit 1 according to the present embodiment outputs time information concerning the time or date to the comparing unit 4. The time information referred to in the present invention includes various types of calendar date information such as the time of day, calendar day, day of the week, month, year, etc. The necessary time information can be selected in accordance with the maintenance interval.

For example, where the maintenance interval is in units of a week, units of a month, or units of a half year, it is also possible to select and output only this information. Also, where the clock and calendar date function are provided at the control unit of the packaging machine 6, it is also possible to fetch the time information from this control unit.

As the time information, time information from a certain reference time is counted and output to the comparing unit 4. As the reference time, a time appropriate for starting the counting of the maintenance interval is used, for example, the time when the mounting machine 6 was installed and started up.

On the other hand, in the storage unit 3, information concerning the maintenance items and maintenance intervals of the mounting machine 6 is input via an input unit 2 constituted by a keyboard and stored. For example, as shown in FIG. 5, in an LM guide (not shown in FIG. 1) of the Z-axis unit of the component supply unit, the maintenance item is the supply of oil selecting the type of oil as No. 2 and the maintenance interval thereof is every month.

In this case, from the input unit 2 to the storage unit 3, the following information is input:

Maintenance position . . . LM guide of the Z-axis unit of the component supply unit;

Maintenance item . . . supply of oil selecting the type of oil as No. 2; and

Maintenance cycle . . . every month (monthly maintenance).

Note that, in inputting a maintenance interval such as "every month", it is also possible to input a specific number of days (for example, 15 days of every month) or input the specific day of the specific week (for example Friday of the second week).

For instance, when inputting a maintenance interval such as "every week", it is sufficient if the specific day of the week, for example, the Friday of every week, is input. Also, at the input of the maintenance interval of "every half year", it is sufficient if the specific number of days of the specific month (for example each 15th day of March and September) is input.

The information format concerning the maintenance items shown in FIG. 5 is stored in the storage unit 3 in a state allowing the maintenance items needed in the mounting machine 6 to be searched for every maintenance interval. For example, where the maintenance items needing monthly maintenance are to be searched, if "every month" is input to the input unit 2 as the maintenance interval, all of the maintenance items corresponding to the monthly maintenance can be output.

The alerting unit 5 according to the present invention is provided with the function of alerting the outside of the fact that there is a corresponding maintenance item at that time and a function of displaying the contents of the maintenance items corresponding to a certain maintenance interval. The alerting unit 5 can be constituted by a display unit, but where a display unit has already been provided in the mounting machine 6, it is also possible to share this.

Note that, the function of alerting the fact that a corresponding maintenance item exists is not restricted only to a display on a display unit. It can be a means which appeals to the visual and acoustic senses of the worker, for example, an alarm light, alarm sound, etc.

The comparing unit 4 of the present embodiment has a function of comparing the information concerning the maintenance intervals stored in the storage unit 3 with the time information input from the time information generation unit 1. Where a corresponding maintenance interval exists, it outputs this fact to the alerting unit 5. Particularly where a corresponding maintenance interval exists, it quickly displays the same on the display unit when the mounting machine 6 is started up.

Also, in addition to this function, it has a function of searching for the corresponding maintenance items from the information stored in the storage unit 3 when the maintenance interval is input from the input unit 2 and displaying them on the alerting unit 5.

These two functions can be constituted in such a manner that when information showing that maintenance is necessary is displayed on the alerting unit 5, a menu from which the detailed maintenance items can be searched is provided on that screen. When the worker selects the search mode, detailed maintenance items corresponding to that maintenance interval are displayed on the alerting unit 5.

Also, even in a case where information showing that maintenance is necessary is not displayed on the alerting unit 5, if the maintenance interval to be searched is input from the input unit 2, it is also possible to display the detailed maintenance items corresponding to that maintenance interval. It is sufficient if these configurations are appropriately selected in accordance with the structure of the used mounting machine 6.

The operation will be explained next.

First, an explanation will be made of the management function of the maintenance interval in the present embodiment referring to FIG. 3.

Before the mounting machine 6 is installed and started up, the maintenance items and maintenance intervals of the members to be maintained are input from the input unit 2 to the storage unit 3 with the information format as shown in FIG. 5 and stored therein (Step 1). Simultaneously, the time information generation unit 1 is initialized.

When the mounting machine 6 is activated from this state, the time information such as the time, calendar day, month, year, or the like counted from a certain reference time is fetched from the time information generation unit 1 into the comparing unit 4 (Step 2). This information and the information of the maintenance interval stored in the storage unit 3 are compared at the comparing unit 4 (Steps 3, 4, and 5).

Here, when there is a corresponding maintenance interval, information showing that maintenance is due is output to the alerting unit 5, which can be a display unit. This fact and the maintenance interval are alerted to the worker (Steps 6, 7, and 8). In this way, the worker can be alerted as to whether the maintenance is necessary merely by viewing the screen of the alerting unit 5 when the packaging machine 6 is started up, whereby mistakes and omission of the maintenance interval can be prevented.

Then, after the worker finishes the maintenance work (Step 9), the worker resets the machine 6 to confirm the end of that maintenance work (Step 10). The above procedures are repeated until the next maintenance interval arrives.

Note that, for a complete confirmation of whether the maintenance work was executed, preferably the display urging maintenance is not deleted from the alerting unit 5 unless the worker resets the machine 6 as in the present embodiment (Step 10).

An explanation will be made next of the function of searching for the detailed maintenance items for every maintenance interval by referring to FIG. 4.

First, in a state where the maintenance information is stored in the storage unit 3 in the same way as in step 1 shown in FIG. 3 (Step 21), the worker inputs the value of the corresponding maintenance interval from the input unit 2 (Step 22).

Based on the input information from this input unit 2, the maintenance items corresponding to the maintenance interval thereof are searched from the storage unit 3 at the comparing unit 4 (Steps 23 and 24), and then the detailed information thereof is output to the alerting unit 5 (Steps 25, 26, and 27). By this, the worker can immediately know the maintenance items to be maintained, and mistakes and omissions of maintenance items can be prevented.

The above explained embodiment is described for facilitating understanding of the present invention and was not described for limitation of the present invention. Accordingly, it is intended that the elements described in the above-described embodiment include all changes of design and equivalent matters belonging to the technical scope of the present invention.

For example, the assembly apparatus of the present invention is not restricted only to a mounting machine of electronic components indicated in the above-mentioned embodiment and can be applied to various other types of assembly apparatus as well.

As mentioned above, according to the present invention, an assembly apparatus is constituted so that the maintenance items and maintenance intervals of the members are stored in a storage unit, a time information signal from a time information generation unit which counts the time information concerning the time from a certain reference time or date and outputs the same is fetched into a comparing unit and is compared with the maintenance intervals stored in the storage unit, and when corresponding maintenance items exist, a signal alerting this fact is output to the outside, therefore the maintenance inspection work is not affected by the working schedule of the worker, and the maintenance is reliably carried out at a suitable timing. In addition, the omission of the maintenance inspection intervals due to an error can be prevented.

Also, the comparing unit outputs the detailed maintenance items corresponding to the maintenance interval by receiving as its input the value of the maintenance interval, and therefore it is not necessary to check the inspection manual every time and examine the maintenance items. Even in a case where many items having different maintenance inspection intervals exist, the mistake and omission of the inspection items can be prevented.

In addition, if the assembly apparatus is constituted so that, as a result of the comparison by the comparing unit, when the corresponding maintenance item exists, this fact is alerted to the outside when the assembly apparatus is activated, the above-described effects are further promoted. Thus it is preferable for the realization of reliable maintenance.

What is claim is:

1. An assembly apparatus including members having maintenance items to be maintained at predetermined maintenance time intervals, the apparatus comprising:

input means for inputting a selected maintenance time interval;

a storage unit for storing the maintenance items and the maintenance time intervals of each of the members;

a time information generation unit for producing time information starting from a certain reference time and for outputting a time information signal, wherein the time information includes time of day, calendar day, day of the week, and month and the reference time is one of a time of installation of each of the members or a most regent time of maintenance of each of the members; and a comparing unit for comparing the selected maintenance time interval input by the input means with the maintenance intervals stored in the storage unit and outputting all maintenance items corresponding to the selected maintenance time interval, wherein the comparing unit further receives the time information signal from the time information generation unit, compares the time information signal with the maintenance intervals stored in the storage unit, and, when the time information signal corresponds to a maintenance interval, outputs an alert signal alerting a user that a corresponding maintenance item is due to be maintained.

2. An assembly apparatus as set forth in claim 1, wherein when a time information signal corresponds to a maintenance interval as a result of the comparison by said comparing unit, said alert signal is outputted when said assembly apparatus is activated.

3. An assembly apparatus as set forth in claim 2, further comprising an alerting unit that outputs said alert signal when it receives said alert signal from said comparing unit.

4. An assembly apparatus as set forth in claim 3, wherein said alerting unit is a display unit.

5. An assembly apparatus as set forth in claim 1, wherein said input means further inputs the maintenance items and the maintenance intervals to update the same in said storage unit.

6. A maintenance management system for managing a maintenance of a mounting apparatus including members to be maintained, the maintenance management system comprising:

storage means for storing maintenance items and corresponding respective maintenance time intervals of the members to be maintained;

time information generation means for generating time information for maintenance of the members with respect to a reference time;

determination means for comparing the maintenance items from the storage means with the time information from the time information generation means and determining whether a maintenance time of each of the members is reached; and input means for inputting a selected maintenance time interval, wherein the determination means compares the selected maintenance time interval with the maintenance time intervals stored in the storage means and outputs a listing of all maintenance items stored in the storage means having respective maintenace time intervals corresponding to the selected maintenance time interval input by the input means.

7. A maintenance management system as set forth in claim 6, further comprising alerting means for outputting an alert signal when said maintenance time is reached.

8. An assembly apparatus as set forth in claim 7, wherein said alerting means includes a display unit.

9. A maintenance management system as set forth in claim 6, wherein said input means is further for inputting the maintenance items and the maintenance intervals to update the same in said storage means.

* * * * *

UNITED STATES PATENT AND TRADEMARK OFFICE
CERTIFICATE OF CORRECTION

PATENT NO. : 5,581,486
DATED : December 3, 1996
INVENTOR(S) : Yukihiro Terada, et. al.

It is certified that error appears in the above-indentified patent and that said Letters Patent is hereby corrected as shown below:

Title page, item [57],

In the Abstract, line 4, after "apparatus" insert --,--
Col.2, line 58, after "constituted" insert --so--
Col.3, line 59, change "wish" to --with--

Col.8, line 2, change "regent" to --recent--

Signed and Sealed this

Twenty-first Day of October 1997

Attest:

BRUCE LEHMAN

Attesting Officer

Commissioner of Patents and Trademarks